US007617696B2

(12) United States Patent
Manole

(10) Patent No.: US 7,617,696 B2
(45) Date of Patent: Nov. 17, 2009

(54) COMPACT REFRIGERATION SYSTEM AND POWER SUPPLY UNIT INCLUDING DYNAMIC INSULATION

(75) Inventor: Dan M. Manole, Tecumseh, MI (US)

(73) Assignee: Tecumseh Products Company, Ann Arbor, MI (US)

( * ) Notice: Subject to any disclaimer, the term of this patent is extended or adjusted under 35 U.S.C. 154(b) by 541 days.

(21) Appl. No.: 10/986,704

(22) Filed: Nov. 12, 2004

(65) Prior Publication Data

US 2006/0101837 A1 May 18, 2006

(51) Int. Cl.
*F25D 23/12* (2006.01)
(52) U.S. Cl. ...................... 62/259.2; 62/513
(58) Field of Classification Search ............... 62/259.2, 62/457.9, 450, 16, 244, 277, 513, 525, 175, 62/510; 165/104.22
See application file for complete search history.

(56) References Cited

U.S. PATENT DOCUMENTS

| | | | |
|---|---|---|---|
| 2,093,471 A | 9/1937 | Newill et al. ................... 62/115 |
| 3,904,933 A | 9/1975 | Davis .......................... 317/100 |
| 4,253,515 A | 3/1981 | Swiatosz ...................... 165/61 |
| 4,322,737 A | 3/1982 | Sliwa, Jr. ..................... 357/82 |
| 4,680,673 A | 7/1987 | Taverdet ..................... 361/385 |
| 4,680,939 A | 7/1987 | Rojey et al. ................... 62/114 |
| 4,756,164 A | 7/1988 | James et al. .................. 62/119 |
| 4,950,181 A | 8/1990 | Porter .......................... 439/485 |
| 5,181,167 A | 1/1993 | Davidson et al. ............. 361/385 |
| 5,315,830 A | 5/1994 | Doke et al. .................... 62/3.2 |
| 5,349,823 A | 9/1994 | Solomon .......................... 62/6 |
| 5,365,749 A | 11/1994 | Porter ......................... 62/259.2 |
| 5,367,879 A | 11/1994 | Doke et al. .................... 62/3.6 |
| 5,491,980 A | 2/1996 | Yingst et al. .................. 62/237 |
| 5,501,076 A | 3/1996 | Sharp, III et al. ............... 62/3.6 |
| 5,647,430 A | 7/1997 | Tajima .................. 165/104.33 |
| 5,862,038 A | 1/1999 | Suzuki et al. ................ 361/704 |
| 5,896,922 A | 4/1999 | Chrysler et al. .............. 165/165 |
| 5,930,135 A | 7/1999 | Janko .......................... 363/144 |
| 5,934,364 A | 8/1999 | Chrysler et al. .............. 165/170 |
| 5,954,127 A | 9/1999 | Chrysler et al. .............. 165/170 |
| 5,963,425 A | 10/1999 | Chrysler et al. .............. 361/695 |
| 5,970,731 A | 10/1999 | Hare et al. .................. 62/196.4 |
| 5,992,168 A | 11/1999 | Pfister et al. ................. 62/259.2 |
| 5,999,404 A | 12/1999 | Hileman ...................... 361/699 |
| 6,029,742 A | 2/2000 | Burward-Hoy ............. 165/80.4 |
| 6,031,751 A | 2/2000 | Janko .......................... 363/144 |
| 6,034,872 A | 3/2000 | Chrysler ...................... 361/699 |
| 6,035,655 A | 3/2000 | Hare et al. .................. 62/259.2 |
| 6,053,238 A | 4/2000 | Goth et al. ..................... 165/10 |
| 6,054,676 A | 4/2000 | Wall et al. ..................... 219/209 |
| 6,058,010 A | 5/2000 | Schmidt et al. .............. 361/689 |
| 6,082,445 A | 7/2000 | Dugan ......................... 165/167 |
| 6,148,635 A | 11/2000 | Beebe et al. ................... 62/498 |

(Continued)

*Primary Examiner*—Melvin Jones
(74) *Attorney, Agent, or Firm*—Baker & Daniels LLP

(57) ABSTRACT

A refrigeration system for use in cooling electronic equipment includes a closed vapor circuit having operably disposed therein, in serial order, a fluid pumping device, a first heat exchanger, a flow regulator and a second heat exchanger. A converter is operably couplable to a power supply and is operably coupled to at least one refrigeration system component. The at least one refrigeration system component is operably coupled to the closed vapor compression circuit. The converter supplies power to the at least one refrigeration system component. The converter further supplies DC power to the electronic equipment being cooled by the refrigeration system.

15 Claims, 5 Drawing Sheets

U.S. PATENT DOCUMENTS

| | | | |
|---|---|---|---|
| 6,167,621 B1 | 1/2001 | Goth et al. | 29/890.054 |
| 6,205,803 B1 | 3/2001 | Scaringe | 62/259.2 |
| 6,213,194 B1 | 4/2001 | Chrysler et al. | 165/80.3 |
| 6,246,581 B1 | 6/2001 | Kang et al. | 361/700 |
| 6,295,826 B1 | 10/2001 | Lee | 62/244 |
| 6,301,109 B1 | 10/2001 | Chu et al. | 361/690 |
| 6,345,512 B1 | 2/2002 | Cosley et al. | 62/259.2 |
| 6,397,618 B1 | 6/2002 | Chu et al. | 62/259.2 |
| 6,404,640 B1 | 6/2002 | Ishimine et al. | 361/720 |
| 6,422,018 B1 | 7/2002 | Tisdale et al. | 60/728 |
| 6,462,949 B1 | 10/2002 | Parish, IV et al. | 361/699 |
| 6,493,223 B1 | 12/2002 | Viswanath et al. | 361/690 |
| 6,542,365 B2 | 4/2003 | Inoue | 361/699 |
| 6,567,269 B2 | 5/2003 | Homer et al. | 361/700 |
| 6,595,018 B2 * | 7/2003 | Goth et al. | 62/259.2 |
| 2002/0050148 A1 | 5/2002 | Shyy et al. | 62/498 |
| 2002/0121094 A1 | 9/2002 | VanHoudt | 62/3.3 |
| 2002/0148237 A1 | 10/2002 | Thiesen et al. | 62/6 |
| 2003/0043542 A1 | 3/2003 | Monfarad | 361/687 |
| 2003/0070792 A1 | 4/2003 | Tanaka et al. | |

* cited by examiner

COMPACT REFRIGERATION SYSTEM AND POWER SUPPLY UNIT INCLUDING DYNAMIC INSULATION

BACKGROUND OF THE INVENTION

1. Field of the Invention

The present invention relates to compact, modular cooling systems.

2. Description of the Related Art

As electronic equipment has become increasingly smaller, the heat dissipation requirements of such equipment is exceeding the capacity of cooling systems employing only forced air to convectively cool the equipment.

Improved compact cooling systems that can be employed to cool such electronic equipment is desirable. It is particularly desirable for such compact cooling systems to cool the electronic equipment in an efficient manner.

SUMMARY OF THE INVENTION

The present invention provides a modular compact cooling system that can be employed in the cooling of electronic equipment. The modular compact cooling system includes a power supply that provides DC power both to a component of the cooling system and to the electronic equipment being cooled. The modular compact cooling system includes a sensing device that measures the DC power supplied to the electronic equipment. The cooling system may vary its cooling capacity to match the cooling needs of the electronic equipment as indicated by the measured DC power drawn by the electronic equipment.

The cooling system may generate an airflow directed through a space between the condenser and evaporator to thereby thermally insulate the evaporator from the condenser. A portion of the airflow may be directed onto the condenser in a direction substantially opposite to a direction of heat conduction from the condenser to the evaporator.

The invention comprises, in one form thereof, a refrigeration system for use in cooling electronic equipment. The refrigeration system includes a closed vapor circuit having operably disposed therein, in serial order, a fluid pumping device, a first heat exchanger, a flow regulator and a second heat exchanger. A converter is operably couplable to a power supply and is operably coupled to at least one refrigeration system component. The at least one refrigeration system component is operably coupled to the closed vapor compression circuit. The converter supplies power to the at least one refrigeration system component. The converter further supplies DC power to the electronic equipment being cooled by the refrigeration system.

The invention comprises, in another form thereof, a method of cooling electronic equipment. The method includes the steps of measuring an amount of power used by the electronic equipment, varying operation of a refrigeration system based upon the measured amount of power, and using the refrigeration system to cool the electronic equipment.

The invention comprises, in yet another form thereof, a compact refrigeration system including a closed vapor compression circuit having operably disposed therein, in serial order, a compressor, a first heat exchanger, an expansion device and a second heat exchanger. The first heat exchanger removes thermal energy from a working fluid circulating through the vapor compression circuit. The second heat exchanger adds thermal energy to the working fluid circulating through the vapor compression circuit. The first and second heat exchangers are disposed within a common structure. The structure defines at least one airflow passageway separating the first heat exchanger from the second heat exchanger. An air moving device generates an airflow through the at least one airflow passageway. The airflow defines a layer of moving air that enters and exits the structure at a substantially common temperature whereby the layer of moving air provides an insulating layer between the first heat exchanger and the second heat exchanger.

The invention comprises, in yet another form thereof, a method of operating a refrigeration system including providing a closed vapor compression circuit having operably disposed therein, in serial order, a compressor, a first heat exchanger, an expansion device and a second heat exchanger. Thermal energy is removed from a working fluid circulating through the vapor compression circuit by use of the first heat exchanger. Thermal energy is added to the working fluid circulating through the vapor compression circuit by use of the second heat exchanger. An airflow between the first heat exchanger and the second heat exchanger is generated such that the airflow provides a thermally insulating layer between the first heat exchanger and the second heat exchanger. A portion of the airflow is directed onto the first heat exchanger.

An advantage of the present invention is that the refrigeration system can meet its own power needs, and does not rely on a possibly inadequate power supply of the electronics that are being cooled.

Another advantage is that the refrigeration system can measure and monitor the amount of power being drawn by the electronics that is being cooled. The refrigeration system can then modify its cooling capacity accordingly to meet the cooling needs of the electronics.

Yet another advantage is that the condenser and the evaporator can be thermally insulated from one another, thereby preserving the cooling ability of the evaporator.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Figure 1:
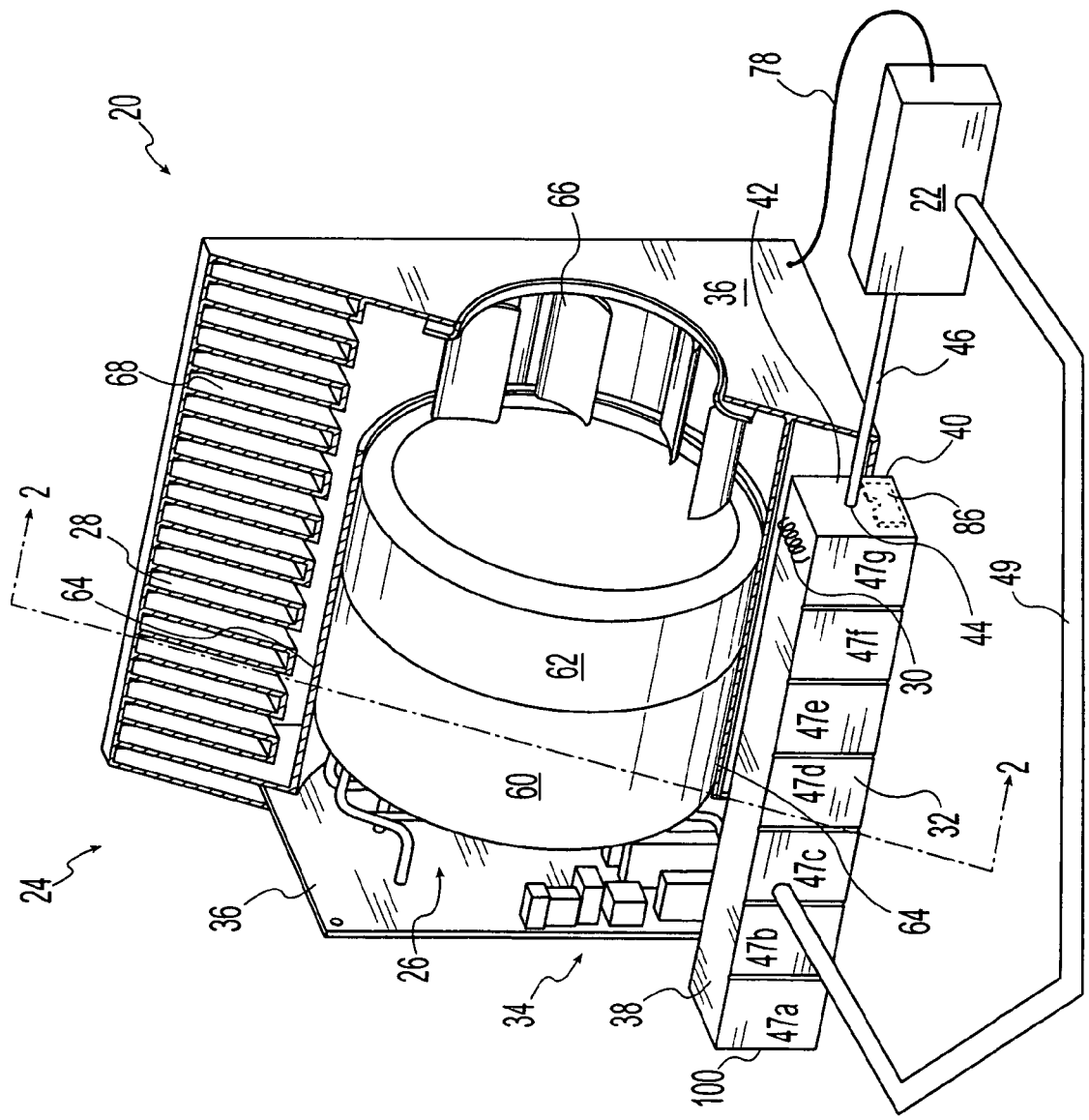
FIG. 1 is a perspective, partially sectional view of one embodiment of a refrigeration system of the present invention configured to cool and power a computer.

Corresponding reference characters indicate corresponding parts throughout the several views. Although the exemplification set out herein illustrate embodiments of the invention, in several forms, the embodiments disclosed below are not intended to be exhaustive or to be construed as limiting the scope of the invention to the precise forms disclosed.

DESCRIPTION OF THE PRESENT INVENTION

In accordance with the present invention, FIG. 1 illustrates one embodiment of a self contained complete refrigeration system (CRS) 20 for a computer 22 or other electronics. CRS 20 includes a closed vapor compression circuit 24 having operably disposed therein, in serial order, a fluid pumping device in the form of a compressor 26, a first heat exchanger in the form of a condenser 28, a flow regulator in the form of a coiled capillary tube 30 which may function as an expansion device, and a second heat exchanger in the form of an evaporator 32. Compression circuit 24 and electronics 34 of CRS 20 are disposed inside a housing 36 of CRS 20. Evaporator 32 has two flat surfaces 38, 40 that are perpendicular to each other and that face an interior of housing 36. A third flat surface 42 is disposed adjacent an outer wall of housing 36 such that surface 42 faces computer 22.

The illustrated CRS 20 does not require the user to add any external tubing to the CRS 20 to direct the refrigerant, or other chilled liquid, to places where the cooling is needed. Heat spreaders such as heat pipes, thermosyphons, thermoelectric devices, or single phase systems can be thermally coupled to the evaporator 32 to transfer the cooling load from evaporator 32 to the locations in the computer where cooling is required. More particularly, surface 42 includes a thermal exchange feature in the form of a socket or cavity 44 in which a heat pipe 46, thermosyphone or other thermally conductive device can be inserted to thermally couple the evaporator 32 with the locations that require cooling, such as computer 22. Moreover, evaporator 32 includes other thermal exchange features in the form of cold plates 47*a-g*, each of which may have a different temperature and/or heat load. Another heat pipe 49 may be thermally connected to computer 22 and to one or more of cold plates 47*a-g*. In the embodiment shown, heat pipe 49 is thermally coupled to cold plate 47*c*. Thus, heat pipe 49 may carry heat from computer 22 to cold plate 47*c*. Both heat pipe 47 and heat pipe 49 thermally interconnect evaporator 32 with computer 22. Alternatively, other types of heat spreaders, such as a finned heat exchanger, can be attached to a surface of evaporator 32 in order to provide cool air for the computer enclosure. The term "thermal exchange feature" as used herein refers to mating faces on evaporator 32 through which heat may be passed to evaporator 32. Examples of such thermal exchange features include cavity 44 and cold plates 47.

In some applications, a Stirling engine might be employed to transfer thermal energy from the heat source (i.e., the electronic equipment being cooled) to a heat sink (i.e., the evaporator) where the temperature difference between the heat source and heat sink are sufficiently great to operate the Stirling engine.

Figure 2:
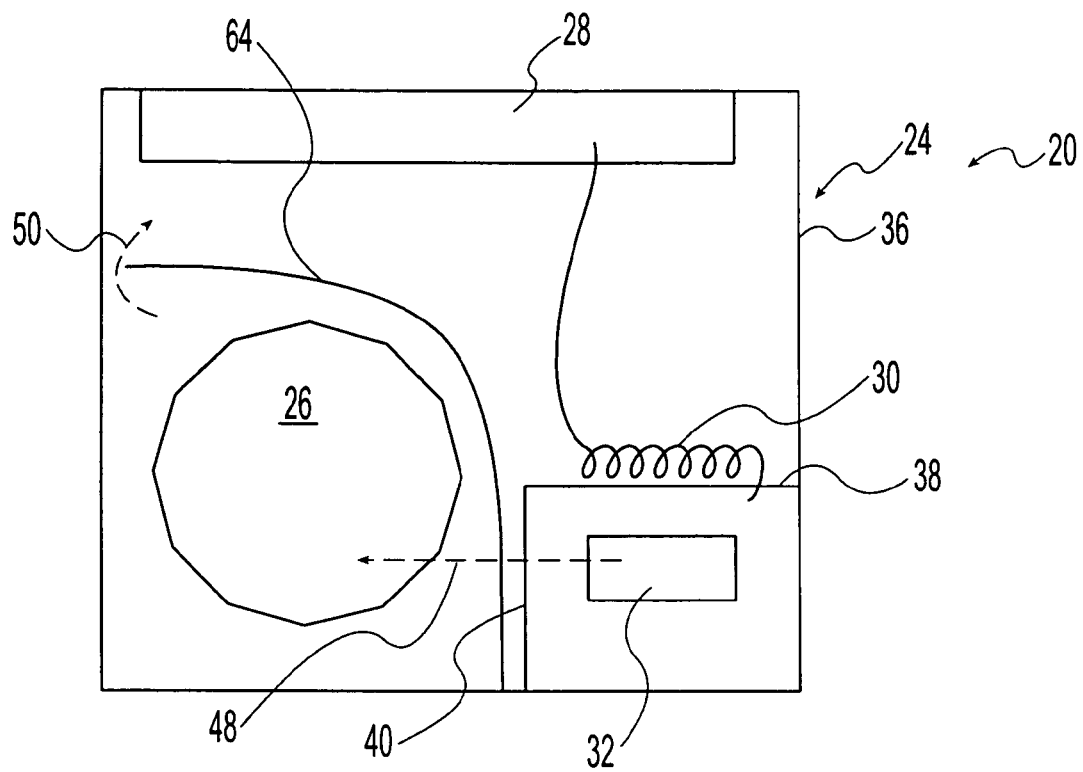
FIG. 2 is a schematic, side view of the refrigeration system of FIG. 1 along line 2-2.
Figure 3:
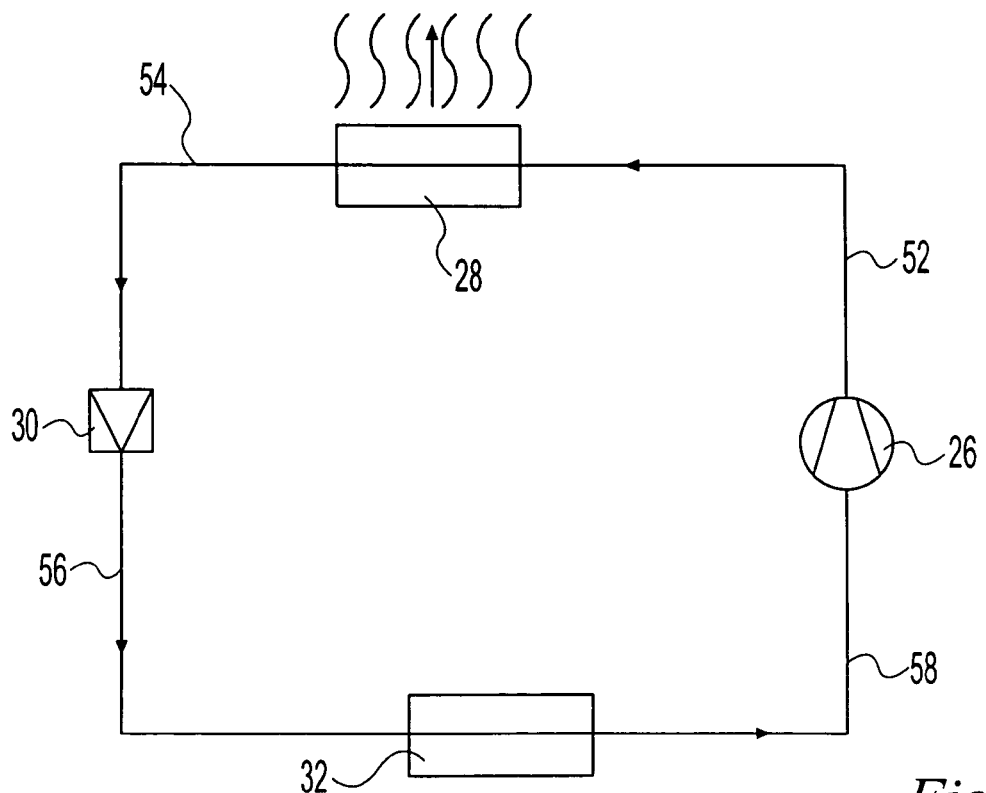
FIG. 3 is a fluid schematic diagram of the refrigeration system of FIG. 1.

FIGS. 2 and 3 schematically illustrate the CRS 20 of FIG. 1. In operation, the compressor 26 receives suction pressure refrigerant from the evaporator 32, as indicated by dashed arrow 48, and discharges compressed refrigerant to the condenser 28, as indicated by dashed arrow 50. Condenser 28 removes thermal energy from the working fluid, while evaporator 32 adds thermal energy to the working fluid. After the high pressure refrigerant is cooled in the condenser 28, high pressure liquid refrigerant enters the evaporator 32 from the condenser 28 through an expansion device such as capillary tube 30. The reduced pressure refrigerant then absorbs thermal energy as it is converted from a liquid phase to a gas phase. Fluid conduits 52, 54, 56 and 58 interconnect compressor 26, condenser 28, expansion device 30 and evaporator 32.

As can be seen in FIG. 1, compressor 26 can be in the form of a horizontally oriented rotary compressor having a compression mechanism 60 and a motor 62. Compressor 26 may be located within a cylindrical, hermetically sealed compartment 64 that is centrally mounted within the CRS 20 in the interior of the housing 36. The interior volume of the compressor compartment 64 may be at either the discharge or suction pressure. Although a rotary compressor mechanism 60 is employed with the CRS 20 illustrated in FIG. 1, other types of compressor mechanisms may also be used.

Condenser 28 may include a fan 66 for blowing or drawing air across and thereby cooling the condenser's fluid-carrying fins 68. Fan 66 may be disposed within housing 36, as shown in FIG. 1, or disposed outside housing 36. If fan 66 is disposed outside housing 36, housing 36 may be provided with slits or other openings for allowing air blown or drawn by fan 66 to impinge upon and between fins 68. The high pressure refrigerant condenses on the interior surfaces of the condenser structure. By providing a significant quantity of vertically oriented interior surfaces within the condenser 28 on the ends walls and condenser fins 68, the condenser facilitates the condensation of the refrigerant by falling film condensation.

The liquid phase refrigerant within the condenser 28 collects at the bottom of the condenser 28 where it enters an expansion device, such as capillary tube 30, and then the evaporator 32 as schematically illustrated in FIG. 2. The refrigerant exiting the evaporator 32 is directed to the intake port of the compressor mechanism 60 and the cycle is then repeated.

Figure 4:
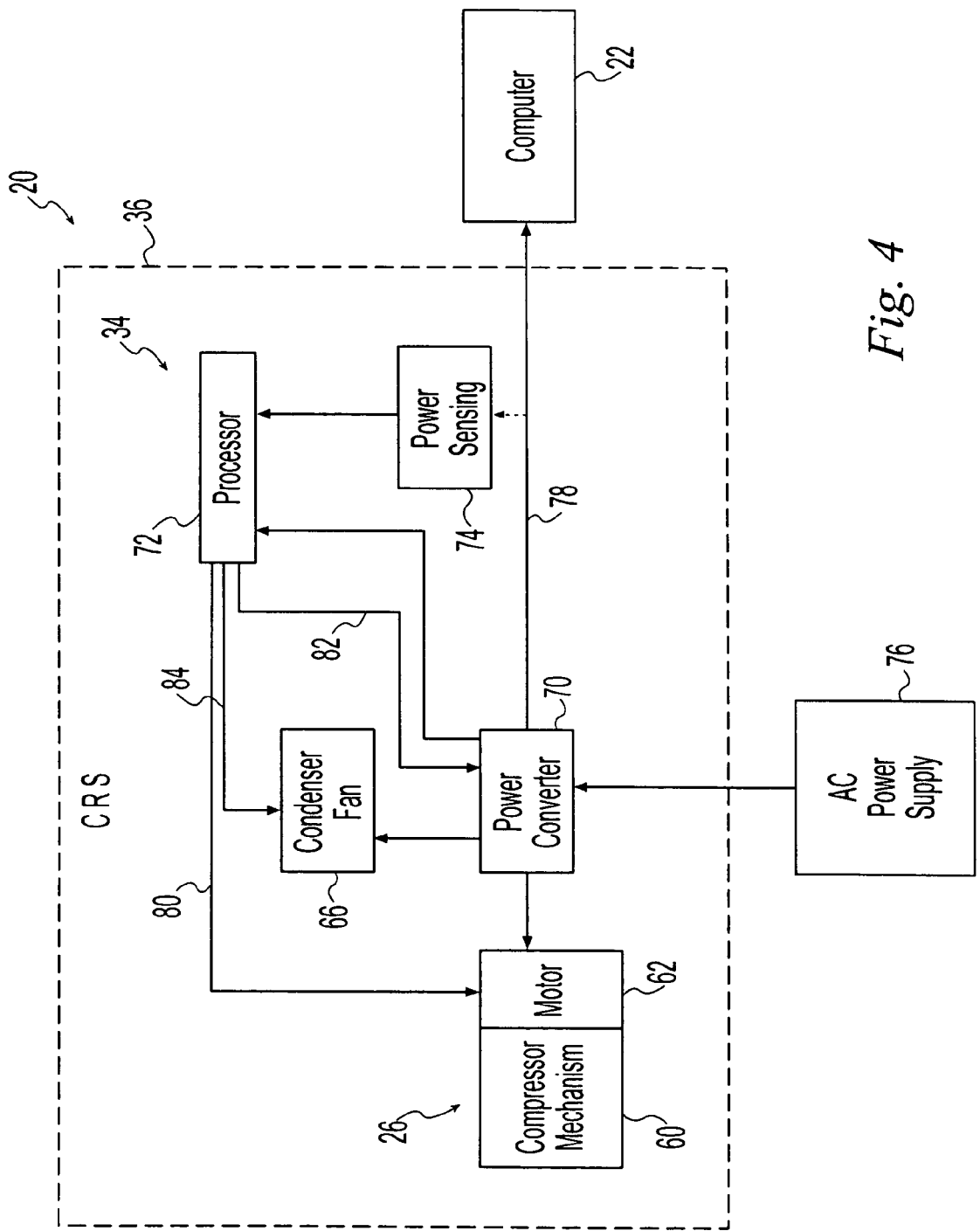
FIG. 4 is an electrical schematic diagram of the refrigeration system and computer of FIG. 1.

Electronics 34 includes a DC power supply in the form of an AC-to-DC converter 70 (FIG. 4), a processor 72 and a power sensing device 74. Converter 70 is operably coupled to an external AC power supply 76 and to refrigeration system components including compressor motor 62 and condenser fan 66. Compressor motor 62 and condenser fan 66 are operably coupled, in turn, to compression circuit 24, such as to compression mechanism 60 and condenser 28, respectively. AC power supply 76 can be a standard wall outlet that provides household current.

Converter 70 converts the AC power from AC power supply 76 into DC power. Converter 70 then supplies the DC power to both computer 22 and the components of refrigeration system 20. The components of refrigeration system 20 that receive DC power from converter 70 may include compressor motor 62, condenser fan 66, processor 72 and power sensing device 74. A different level of DC voltage, current and power may be provided to each of the components of refrigeration system 20 and to computer 22 by converter 70.

Power sensing device 74 may measure the DC power supplied to the electronic equipment, such as computer 22, that is cooled and powered by CRS 20. That is, power sensing device 74 may measure the DC power supplied to computer 22 via power line 78. For example, power sensing device 74 may include a known resistance (not shown) disposed in power line 78. Power sensing device 74 may measure and monitor the voltage drop across the known resistance to thereby determine the power level, as is well known in the art.

Processor 72 is in communication with power sensing device 74 and may receive from device 74 information related to the power consumption of computer 22. Processor 72 may receive only voltage measurements or similar data from device 74, and processor 72 may calculate the power consumption of computer 22 based upon this data. Based upon the power consumption of computer 22, and perhaps other variables, processor 72 may determine and/or predict the cooling needs of computer 22 and modify the operation of CRS 20 accordingly.

Processor 72 may be operably coupled to compressor 26, which may have a variable rate of displacement. For example, compressor 26 may have a variable stroke length and/or a variable operating speed, either of which may result in a variable rate of displacement. More particularly, processor 72 may control the level of DC voltage that is applied to motor 62, which drives compressor mechanism 60. By varying the DC voltage applied to motor 62, the operating speed of compressor mechanism 60 may be controlled. Thus, processor 72 may control the operating speed of compressor 26 as a function of variables including measurements obtained from power sensing device 74. Processor 72 may send control signals to motor 62 directly, such as via a line 80. Alternatively, processor 72 may send control signals to power converter 70 via line 82 in order to control the DC voltage applied to motor 62 by converter 70.

Similarly, processor 72 may be operably coupled to condenser fan 66, which may have a variable operating speed. More particularly, processor 72 may control the level of DC voltage that is applied to fan 66. By varying the DC voltage applied to fan 66, the operating speed of fan 66 may be controlled. Thus, processor 72 may control the operating speed of fan 66 as a function of variables including measurements obtained from power sensing device 74. Processor 72 may send control signals to fan 66 directly, such as via a line 84. Alternatively, processor 72 may send control signals to power converter 70 via line 82 in order to control the DC voltage applied to fan 66 by converter 70.

Processor 72 may store the measurements from power sensing device 74 and identify cyclical patterns in the measured amount of power used by computer 22. The power consumption of computer 22 may have a cyclical pattern that repeats on a daily basis. For example, the power consumption of computer 22 may be very low from 5 p.m. to 8 a.m., i.e., outside of office hours, during a lunch hour of 12 noon to 1 p.m., and/or during a coffee break from 3:00 p.m. to 3:15 p.m. On the other hand, the power consumption of computer 22 may be higher during working hours from 8 a.m. to 12 noon, from 1 p.m. to 3 p.m., and from 3:15 p.m. to 5 p.m.

Processor 72 may vary the operation of CRS 20 based upon the identified cyclical pattern. More particularly, processor 72 may anticipate that the cyclical pattern of power consumption will repeat, and processor 72 may vary the operation of CRS 20 based upon the anticipated repetition of the pattern of power consumption. For example, at 7:55 a.m., when computer 22 is at a standby state, processor 72 may increase the DC voltage applied to motor 62 and/or fan 66 based upon an anticipation that an identified cyclical pattern will be repeated, and that computer 22 will begin to be operated at 8 a.m. Thus, CRS 20 may be provided with additional cooling capacity in order to more quickly meet the anticipated additional cooling needs of computer 22 at 8:00 a.m. CRS 20 may also provide additional cooling to computer 22 in order to lower the temperature of computer 22 before, and in anticipation of, the increased power consumption at 8:00 a.m.

Similarly, processor 72 may decrease the cooling capacity of CRS 20 in anticipation of computer 22 using less power according to the repetition of a cyclical pattern. For example, at 11:55 a.m., when computer 22 is operating in a highly active state, processor 72 may decrease the DC voltage applied to motor 62 and/or fan 66 based upon an anticipation that an identified cyclical pattern will be repeated, and that computer 22 will begin to draw less power at 12 noon. Thus, the cooling capacity of CRS 20 can be decreased so that CRS 20 consumes less power yet is still able to adequately meet the anticipated reduced cooling needs of computer 22 after 12 noon. CRS 20 may also provide a reduced level of cooling to computer 22 before noon, thereby allowing the temperature of computer 22 to rise before and in anticipation of the decreased power consumption at 12 noon.

It is also possible for CRS 20 to store cooling effect in an optional cooling effect storage device 86 that is schematically indicated in dashed lines in FIG. 1. In one embodiment, cooling effect storage device 86 can be selectively placed in contact with heat pipe 46 in order to cool device 86 to a desired level. Device 86 can then be removed from contact with heat pipe 46 to thereby store cooling effect in device 86 for later use. For example, processor 72 may anticipate that computer 22 will consume less power during the user's coffee break from 3:00 p.m. to 3:15 p.m. Because the user may prefer that CRS 20 produce less noise during the coffee break, processor 72 may lower the voltage to motor 62 and/or fan 66 to less than a stand-by level. To compensate for the resulting drop in cooling capacity of CRS 20, processor 72 may cause cooling effect storage device 86 to once again come into contact with heat pipe 46, and thereby provide cooling effect to computer 22 from storage device 86 via heat pipe 46. Thus, beginning at approximately 3 p.m., i.e., slightly before or slightly after 3 p.m., the cooling effect stored in device 86 can be selectively used to quietly cool computer 22 during and/or in anticipation of the user's coffee break.

Cooling effect storage device 86 may also be selectively used to cool the electronic equipment based the measured amount of power consumption without identifying any cyclical patterns in the power consumption. For example, cooling effect can be stored in storage device 86 and may be used by moving device 86 into contact with heat pipe 46 in response to an increase in the measured power drawn by computer 22.

Figure 5:
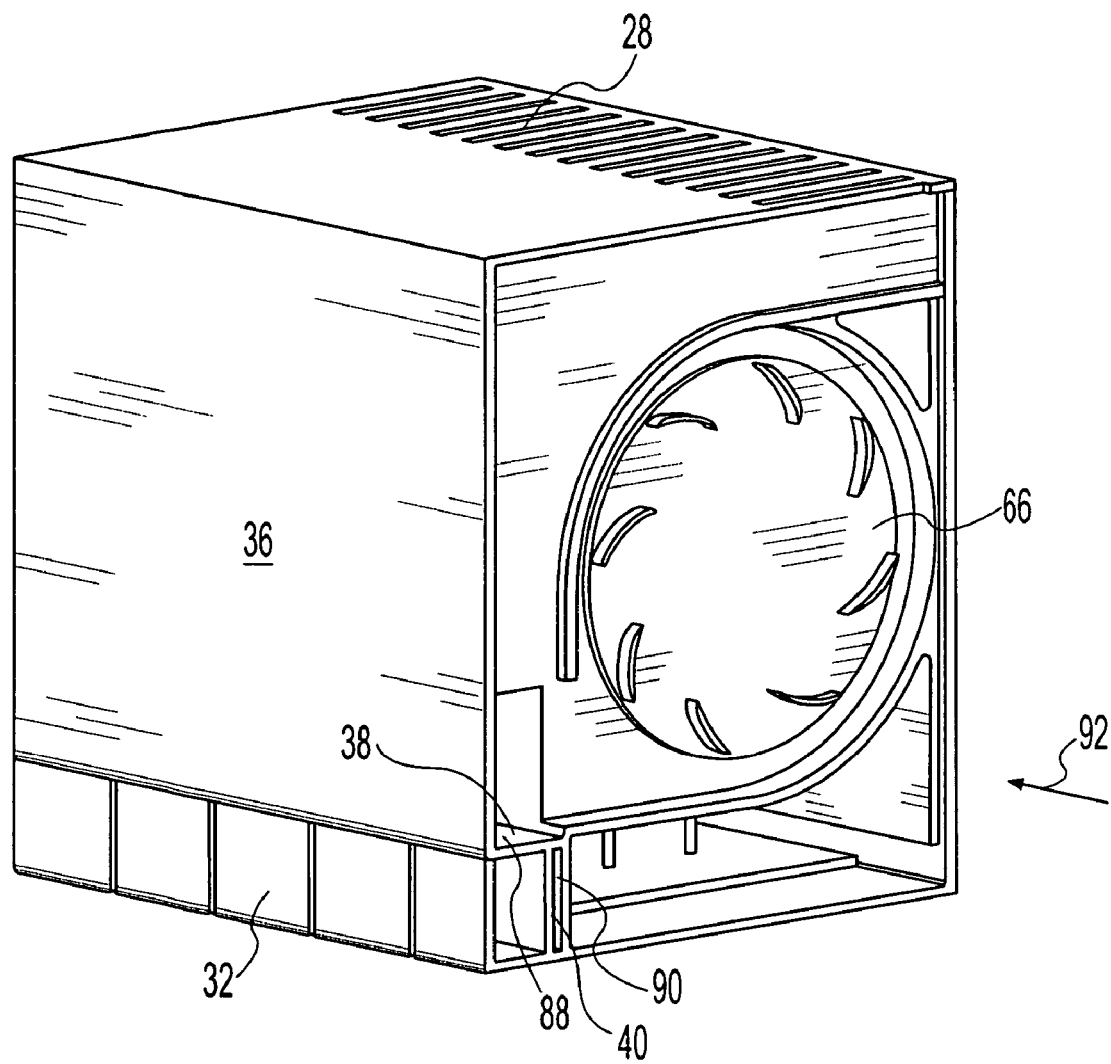
FIG. 5 is another perspective, partially sectional view of the refrigeration system of FIG. 1.

CRS 20 provides a compact design in which the relatively warm condenser 28 is disposed close enough to the relatively cool evaporator 32 that evaporator 32 may absorb heat from condenser 28. Such heat absorption by evaporator 32 may reduce the efficiency of evaporator 32, and thus is to be avoided. In order to reduce the amount of heat from condenser 28 that is absorbed by evaporator 32, CRS 20 may makes use of dynamic insulation. Specifically, housing 36 may define airflow passageways 88, 90 (FIG. 5) that separate condenser 28 from evaporator 32. Airflow passageway 88 may extend along the length of surface 38 of evaporator 32, and airflow passageway 90 may extend along the length of surface 40 of evaporator 32.

An air moving device, such as condenser fan 66, can generate airflows through airflow passageways 88, 90 in a general direction indicated by arrow 92. More particularly, housing 36 may be provided with airflow conduits 94, 96 (FIG. 6) that direct airflows from fan 66 toward condenser 28 and passageways 88, 90, respectively. Air flow passageways 88, 90 may each be defined by at least one high density heat exchange surface for facilitating the adjustment of the orientation of the airflows. Fan 66 may draw air from outside housing 36 into housing 36 and into airflow conduits 94, 96. Alternatively, instead of fan 66, a separate dedicated fan may be provided to blow or draw air from outside housing 36 and into passageways 88, 90

The airflows through passageways 88, 90 define layers of moving air that may provide thermally insulating layers between condenser 28 and evaporator 32, and thus improve the efficiency of CRS 20. The layers of moving air may enter housing 36 and exit housing 36 at a substantially common temperature. That is, any heat absorbed from condenser 28 by the layers of moving air can be approximately offset by the heat absorbed from the layers of moving air by evaporator 32.

Figure 6:
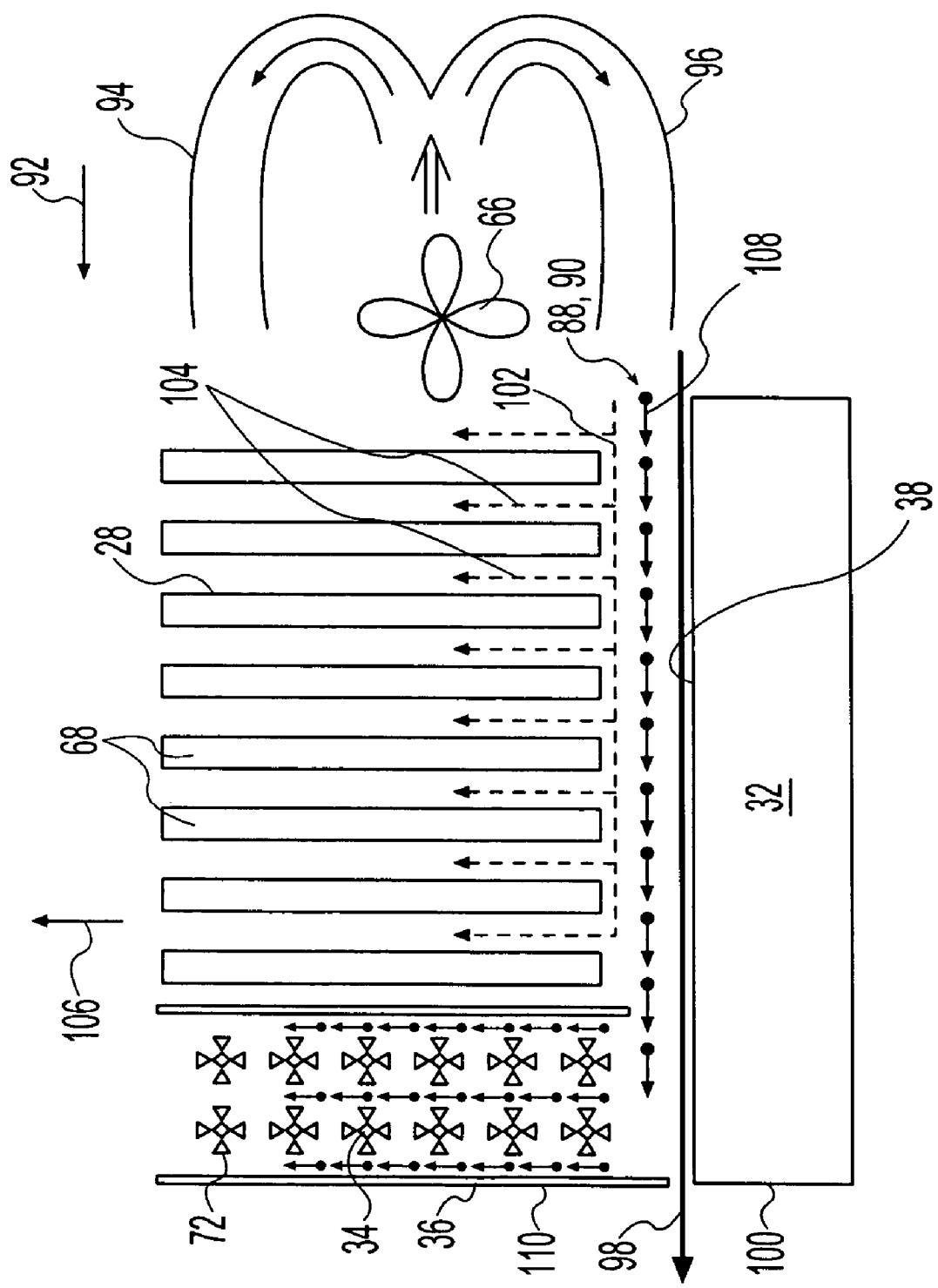
FIG. 6 is an airflow diagram of the refrigeration system of FIG. 1.

As indicated in FIG. 6, the airflows through passageways 88, 90 may be divided into multiple portions that may be directed to different places within and/or outside housing 36. A first portion 98 may flow adjacent to surface 38 and/or surface 40 along the length of evaporator 32. Portion 98 is shown as exiting housing 36 at a location near an end 100 of evaporator 32.

A second portion 102 of the airflow may flow along a side of passageways 88, 90 opposite from first portion 98. That is, second portion 102 may be the portion of the airflow that is closest to condenser 28. After flowing along passageways 88, 90 for some distance, all or substantially all of second portion 102 may be directed onto condenser 28. More particularly, as shown in FIG. 6, as second portion 102 flows in direction 92, a respective one of a plurality of fractions 104 of second portion 102 is redirected between each pair of adjacent fins 68 that are passed by second portion 102. Thus, fractions 104 of second portion 102 are directed in a direction 106 that may be opposite to a direction of heat conduction from condenser 28 to evaporator 32.

The direction of fractions 104, and the separation of fractions 104 from second portion 102, may be caused by airfoils (not shown) or some other type of air guiding element within housing 36. It is also possible for the redirection and separation of fractions 104 to be caused by the fins 68 themselves.

A third portion 108 of the airflow may flow between portions 98 and 102 within passageways 88, 90. After flowing along passageways 88, 90 for some distance, all or substantially all of third portion 108 may be directed onto electronics 34 including power supply 72. In the embodiment shown in FIG. 6, electronics 34 and power supply 72 are disposed at an end of housing 36 that is adjacent to end 100 of evaporator 32.

Third portion 108 may be substantially surrounded and thermally insulated by portions 98, 102. Thus, third portion 108 may remain at a substantially constant temperature while flowing along passageways 88, 90 and until being directed onto electronics 34. It is also possible for the temperature of third portion 108 when it reaches electronics 34 to be substantially equal to the temperature of the air within airflow conduit 96.

The directing or guiding of third portion 108 onto electronics 34 may be caused by airfoils (not shown) or some other type of air guiding element within housing 36. It is also possible, as indicated in FIG. 6, for the directing or guiding of third portion 108 onto electronics 34 to be caused by an end wall 110 of housing 36 that is adjacent to electronics 34.

The refrigeration system of the present invention has been described herein as including a compressor. However, it is also possible for the refrigeration system to include another type of fluid pumping device, such as a conventional pump. If the refrigeration system includes a conventional pump, the refrigeration system may include a type of flow regulator other than a capillary tube or an expansion device.

The refrigeration system has also been described as including a converter that is operably coupled to an AC power supply and that supplies DC power to a refrigeration system component. However, it is also possible for the converter to be operably coupled to a DC power supply, and/or to supply AC power to a refrigeration system component. Thus, the converter may use whatever power supply is available as input and, while providing DC power to the electronic equipment cooled by the refrigeration system, also provide AC or DC power to the refrigeration system component.

While this invention has been described as having an exemplary design, the present invention may be further modified within the spirit and scope of this disclosure. This application is therefore intended to cover any variations, uses, or adaptations of the invention using its general principles.

What is claimed is:

1. A compact refrigeration system comprising:
    a closed vapor compression circuit having operably disposed therein, in serial order, a compressor, a first heat exchanger, an expansion device and a second heat exchanger;
    said first heat exchanger removing thermal energy from a working fluid circulating through said vapor compression circuit and said second heat exchanger adding thermal energy to the working fluid circulating through said vapor compression circuit, said first heat exchanger having an airflow inlet;
    said first and second heat exchangers being disposed within a common structure, said structure defining at least one insulating airflow passageway separating said first heat exchanger from said second heat exchanger;
    said insulating airflow passageway having an inlet positioned to bring ambient air from outside the structure into the insulating airflow passageway and an outlet positioned to discharge insulating airflow from the structure, said insulating airflow passageway extending along a length of the second heat exchanger, said outlet not in flow communication through said second heat exchanger; and
    an air moving device generating an insulating airflow through said at least one airflow passageway wherein said airflow defines a layer of insulating moving air that enters and exits said insulating airflow passageway without passing through either of said first and second heat exchangers whereby said layer of moving air provides an insulating layer between said first heat exchanger and said second heat exchanger.

2. The system of claim 1 wherein said air moving device generates a second airflow directed onto said first heat exchanger.

3. The system of claim 1 wherein said second heat exchanger includes two surfaces facing an interior of said structure, the airflow moving across both of said surfaces.

4. The system of claim 3 wherein said surfaces are oriented substantially perpendicular to one another.

5. The system of claim 1 wherein said at least one airflow passageway is defined by at least one high density heat exchange surface.

6. A method of operating a refrigeration system comprising:
    providing in a housing a closed vapor compression circuit having operably disposed therein, in serial order, a compressor, a first heat exchanger, an expansion device and a second heat exchanger;
    removing thermal energy from a working fluid circulating through said vapor compression circuit by use of said first heat exchanger;
    adding thermal energy to the working fluid circulating through said vapor compression circuit by use of said second heat exchanger;
    generating an insulating airflow stream between said first heat exchanger and said second heat exchanger such that said airflow provides a thermally insulating layer between said first heat exchanger and said second heat exchanger said insulating airflow stream flowing through said housing without passing through either of said first or second heat exchangers.

7. The method of claim 6 wherein the airflow stream has a first portion, a second portion and a third portion, the first portion being directed onto said first heat exchanger, said method comprising the further steps of:
    directing the second portion onto electronics of the refrigeration system; and
    directing the third portion along a length of said second heat exchanger.

8. The method of claim 7 wherein the second portion of the airflow remains at a substantially constant temperature until being directed onto the electronics.

9. The method of claim 8 wherein the electronics includes a power supply, said method comprising the further steps of:
   cooling a device by use of the refrigeration system; and
   providing power to both the refrigeration system and the cooled device by use of said power supply.

10. The method of claim 6 wherein a portion of the airflow is directed in a direction substantially opposite to a direction of heat conduction from said first heat exchanger to said second heat exchanger.

11. The method of claim 6, wherein the insulating airflow enters and exits the housing at substantially the same temperature.

12. The method of claim 6, wherein the airflow stream has a first layer, a second layer and a third layer, said second layer being intermediate the first and second layers, said method comprising the further steps of:
   directing the second layer onto electronics of the refrigeration system; and
   directing the third layer along a length of the second heat exchanger.

13. The method of claim 6 wherein the airflow stream has a first layer, a second layer and a third layer, said second layer being intermediate the first and third layers, and wherein the second layer remains at a substantially constant temperature.

14. The method of claim 13 wherein the first layer is directed in a direction substantially opposite to a direction of heat conduction from said first heat exchanger to said second heat exchanger.

15. The method of claim 6 wherein the airflow stream has a first layer, a second layer and a third layer, said second layer being intermediate the first and third layers, wherein the second layer enters and exits the housing at substantially the same temperature.

* * * * *

UNITED STATES PATENT AND TRADEMARK OFFICE
CERTIFICATE OF CORRECTION

PATENT NO. : 7,617,696 B2  Page 1 of 1
APPLICATION NO. : 10/986704
DATED : November 17, 2009
INVENTOR(S) : Dan M. Manole It is certified that error appears in the above-identified patent and that said Letters Patent is hereby corrected as shown below:

On the title page Item (54)

IN THE TITLE: after SUPPLY remove [UNIT]

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,617,696 B2  Page 1 of 1
APPLICATION NO. : 10/986704
DATED : November 17, 2009
INVENTOR(S) : Dan M. Manole It is certified that error appears in the above-identified patent and that said Letters Patent is hereby corrected as shown below:

On the title page Item (54) and at Column 1, line 2,

IN THE TITLE: after SUPPLY remove [UNIT]

This certificate supersedes the Certificate of Correction issued January 19, 2010.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,617,696 B2
APPLICATION NO. : 10/986704
DATED : November 17, 2009
INVENTOR(S) : Dan M. Manole It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 673 days.

Signed and Sealed this

Nineteenth Day of October, 2010

David J. Kappos
*Director of the United States Patent and Trademark Office*